United States Patent
Skerritt et al.

(10) Patent No.: US 6,788,067 B1
(45) Date of Patent: Sep. 7, 2004

(54) DEVICE FOR AND METHOD OF DETECTING RESIDUAL CURRENT WITH RESISTIVE SHUNTS

(75) Inventors: Robert Charles Skerritt, Conwy (GB); Mark David Crosier, Isle of Anglesey (GB); Martin Anthony Murray, Bangor (GB); Brian Martin Reeder, Isle of Anglesey (GB)

(73) Assignee: Delta Electrical Limited (GB)

( * ) Notice: Subject to any disclaimer, the term of this patent is extended or adjusted under 35 U.S.C. 154(b) by 0 days.

(21) Appl. No.: 09/720,782

(22) PCT Filed: Jun. 30, 1999

(86) PCT No.: PCT/GB99/02060

§ 371 (c)(1),
(2), (4) Date: Dec. 27, 2000

(87) PCT Pub. No.: WO00/00834

PCT Pub. Date: Jan. 6, 2000

(30) Foreign Application Priority Data

Jun. 30, 1998 (GB) .............................................. 9813982

(51) Int. Cl.⁷ ........................ G01R 31/02; G01R 15/04; G01R 33/00; G01R 31/14

(52) U.S. Cl. ...................... 324/421; 324/424; 324/127; 324/142; 324/128; 324/117 R; 324/126; 324/509

(58) Field of Search .............................. 702/60; 335/18; 324/421, 424, 127, 142, 128, 117 R, 509, 126, 108, 86; 361/42, 44, 45, 58, 87, 46; 327/513; 338/49

(56) References Cited

U.S. PATENT DOCUMENTS

| | | | | |
|---|---|---|---|---|
| 4,566,053 A | * | 1/1986 | Strickland, Jr. ............... 361/42 |
| 4,734,634 A | * | 3/1988 | Kito et al. .................. 318/778 |
| 4,743,875 A | | 5/1988 | Murphy ....................... 335/18 |
| 4,866,559 A | * | 9/1989 | Cobb, III et al. ............ 361/103 |
| 4,897,756 A | * | 1/1990 | Zylstra ........................ 361/44 |
| 4,939,451 A | * | 7/1990 | Baran et al. ................. 324/127 |
| 5,181,026 A | * | 1/1993 | Granville ................ 340/870.28 |
| 5,223,789 A | * | 6/1993 | Katsuyama et al. ......... 324/127 |
| 5,287,107 A | * | 2/1994 | Gampell et al. ............. 341/137 |
| 5,430,636 A | * | 7/1995 | Kachi ........................... 363/58 |
| 5,475,557 A | * | 12/1995 | Larom et al. .................. 361/46 |
| 5,485,393 A | | 1/1996 | Bradford ...................... 702/60 |
| 5,490,030 A | * | 2/1996 | Taylor et al. .................. 361/45 |
| 5,534,788 A | * | 7/1996 | Smith et al. ................. 324/771 |
| 5,563,506 A | | 10/1996 | Fielden et al. .............. 324/142 |
| 5,568,343 A | * | 10/1996 | Kosugi ......................... 361/36 |
| 5,701,253 A | | 12/1997 | Mayell et al. ................ 702/60 |
| 5,809,451 A | * | 9/1998 | Parsons et al. ............. 702/190 |
| 5,867,054 A | | 2/1999 | Kotowski .................... 327/513 |
| 5,875,087 A | | 2/1999 | Spencer et al. ............... 361/87 |
| 5,914,674 A | * | 6/1999 | Coleman et al. ........ 340/870.09 |
| 5,930,093 A | * | 7/1999 | Morrissett ..................... 361/42 |
| 6,005,758 A | * | 12/1999 | Spencer et al. ............... 361/64 |
| 6,028,426 A | * | 2/2000 | Cameron et al. ........... 324/125 |
| 6,031,749 A | * | 2/2000 | Covington et al. ........... 363/98 |
| 6,034,521 A | * | 3/2000 | Eckardt ........................ 324/96 |
| 6,058,354 A | * | 5/2000 | Adame et al. ................ 702/60 |
| 6,191,989 B1 | * | 2/2001 | Luk et al. .................... 365/207 |
| 6,233,128 B1 | * | 5/2001 | Spencer et al. ............... 361/86 |
| 6,239,589 B1 | | 5/2001 | Windsheimer .............. 324/142 |
| 6,259,267 B1 | * | 7/2001 | Fujiwara ..................... 324/765 |
| 6,313,690 B1 | * | 11/2001 | Ohshima .................... 327/427 |
| 6,335,852 B1 | * | 1/2002 | Nimmo ..................... 361/93.2 |
| 6,356,426 B1 | * | 3/2002 | Dougherty .................. 361/102 |

FOREIGN PATENT DOCUMENTS

| | | |
|---|---|---|
| CA | 2244692 | 2/1999 |
| DE | 3815824 | 1/1989 |
| EP | 0612081 | 2/1994 |
| EP | 0 612 081 A1 | 8/1994 |
| GB | 2318002 | 8/1998 |
| JP | 4083175 | 3/1992 |

* cited by examiner

Primary Examiner—Andrew H. Hirshfeld
Assistant Examiner—Wasseem H. Hamdan
(74) Attorney, Agent, or Firm—Kirk D. Houser; Eckert Seamans Cherin & Mellott, LLC

(57) ABSTRACT

A residual current detection device comprising a plurality of resistive shunts for connection in respective ones of a plurality of lines though which current can flow to and from a load, and detector means sensitive to the voltage developed across each of the shunts to detect any imbalance between the currents flowing though the shunts.

16 Claims, 4 Drawing Sheets

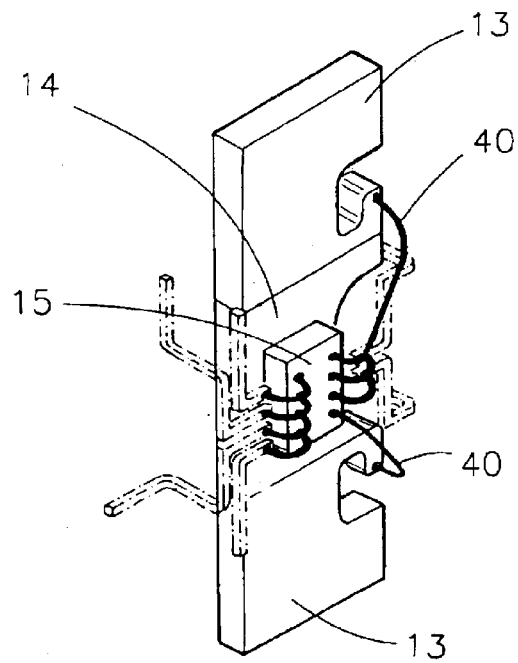 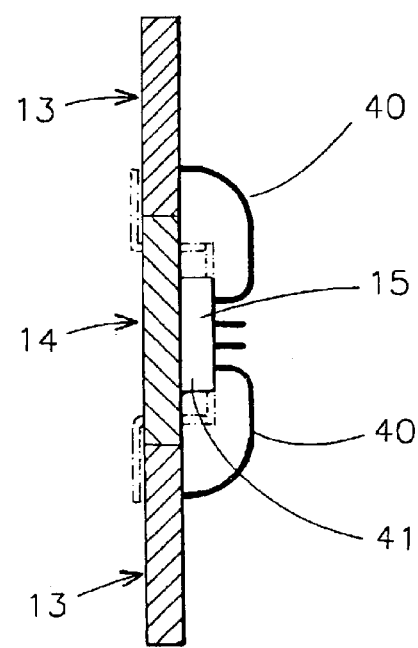
FIG 3   FIG 4
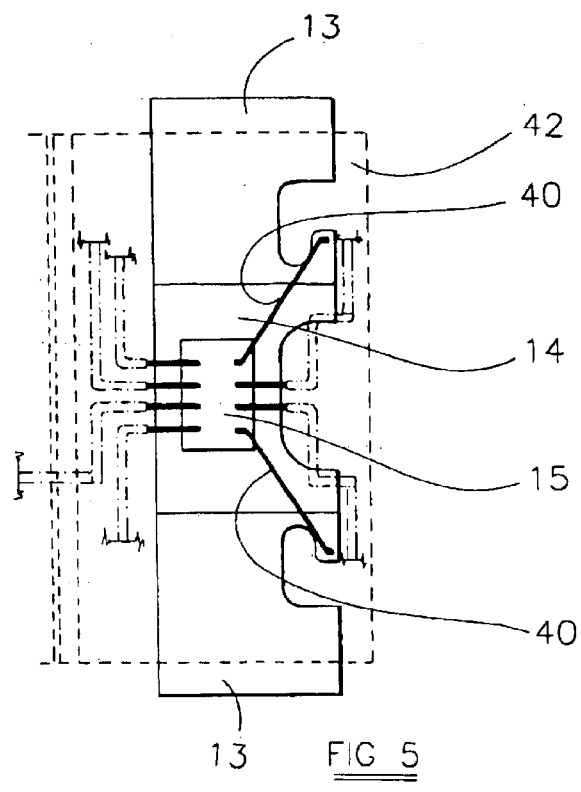
FIG 5

DEVICE FOR AND METHOD OF DETECTING RESIDUAL CURRENT WITH RESISTIVE SHUNTS

BACKGROUND OF THE INVENTION

This invention relates to a residual current detection device for use in a circuit breaker.

DESCRIPTION OF THE PRIOR ART

Conventionally, residual current is detected utilizing a current transformer having primary windings through which, in the case of a single phase device, load current flows in opposite directions so that if the return current is different from the outwardly flowing current because of current leakage an output current signal is induced in a secondary winding of the transformer. In the case of a multi-phase device, primary windings of the transformer are connected in all of the phase lines and the neutral line. In normal situations, when there is no current leakage, the net current induced in the secondary winding is zero and therefore no output is detected.

Sophisticated materials have been developed for the core of the current transformer, which enable considerable accuracy to be obtained when the currents flowing in the primary windings are substantially sinusoidal. However, switch mode power supplies are often used for computers and other equipment and there is an increasing tendency for such equipment to cause dc offsets in the currents. Such developments have made detectors utilizing current transformers less reliable and prone to false tripping or failure to detect a dc current leakage.

This is a particular problem in the case of directly actuated electro-mechanical devices, where the current transformer secondary winding actually drives an actuator. The situation is not much improved, when including an electronic detection and amplification means connected to the secondary winding, as there are still problems with high frequency transients and dc offsets. A very small dc current level can cause the core to saturate thereby seriously impairing the ability of the detector to detect current leakage.

OBJECTIVES AND SUMMARY OF THE INVENTION

It is an object of the present invention to provide a residual current detection device in which the above mentioned problems are substantially overcome in a simple and efficacious manner.

In accordance with the invention there is provided a residual current detection device comprising a plurality of resistive shunts for connection in respective ones of a plurality of lines though which current can flow to and from a load, and detector means sensitive to the voltage developed across each of the shunts to detect any imbalance between the currents flowing though the shunts.

Preferably, the detector means comprises an analog to digital converter for each shunt and a processor for receiving the digital signals from the converters and determining whether a current imbalance exists.

Each shunt preferably takes the form of a composite strip having conductive portions at its ends and a resistive portion interconnecting the conductive portions. Such composite strips can be mass produced inexpensively to very high tolerances which makes them extremely suitable for this purpose.

The analog to digital converter for each shunt may include a delta-sigma modulator, which generates a high frequency single digital data stream which is converted by decimation filtering to a multibit digital data stream at a lower frequency.

The analog to digital converter for each shunt is preferably connected to the processor through an isolation barrier so that the converter can float at the voltage level of the shunt which it serves. The decimation filtering may be effected entirely in the converter, entirely in the processor or split between the converter and the processor.

BRIEF DESCRIPTION OF THE DRAWINGS

In the accompanying drawings:

FIG. 3 is a perspective view showing one of the current sensing devices, FIG. 4 is a sectional view of the current sensing device of FIG. 3, FIG. 5 is an elevation of the device of FIG. 3.

DETAILED DESCRIPTION OF THE INVENTION

Figure 1:
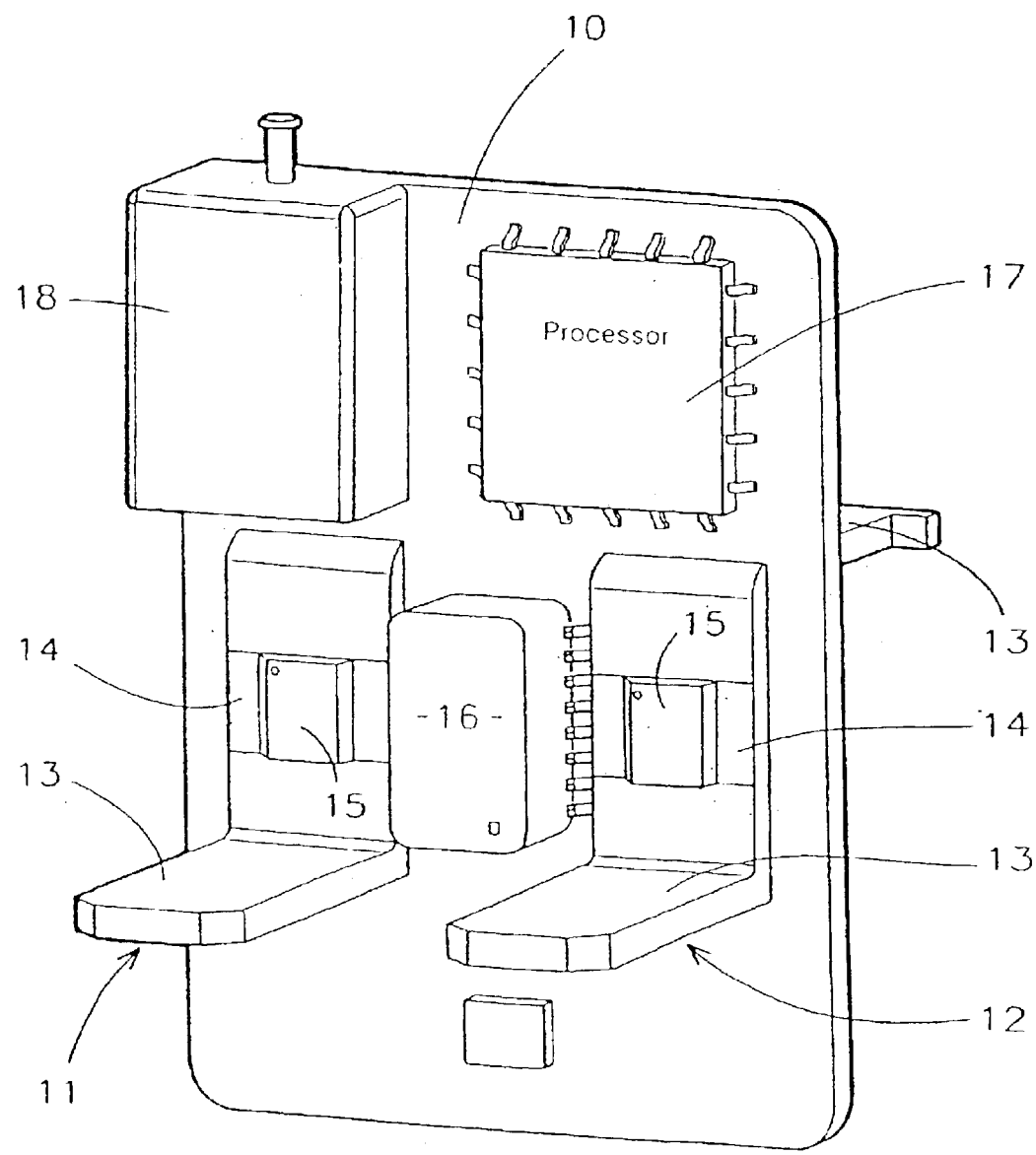
FIG. 1 is a diagrammatic perspective view of an example of the invention as applied to a single phase device.

In the device shown in FIG. 1, a substrate 10 supports two composite conductor strips 11, 12. Each of these includes end portions 13 of copper and an intermediate portion 14 of a resistive material such as manganin. The strips are formed by slicing up a sandwich formed by electron beam welding the copper portions to opposite sides of the manganin portion. The shunts formed by the resistive portions manufactured by this method can have a nominal resistance of 0.2 mΩ to a tolerance of less than 5%. If the two shunts 14 used on one device are pressed from adjacent portions of the sandwich stock, they are matched to within 2%. Calibration of the shunts built into a unit at two different temperatures can virtually eliminate shunt errors.

In the example shown in FIG. 1, there is a separate signal pre-processing ASIC 15 mounted on each of the shunts 14 and connected to the copper end portions 13 of the associated conductor strips. The two ASICs 15 are connected to via an isolation transformer array 16 to a main processor 17. The ASICs 15 operate to convert the two voltages across the shunts into a digital signal stream which is communicated to the processor 17 via the isolation transformer array. The main processor is programmed to provide a drive signal to a trip actuator 18.

The actual preferred structural configuration of the sensors is shown in FIGS. 3 to 5. These show leads 40 connecting two analog input terminals of the ASIC to the two copper end portions. Other leads connect other terminals of the ASIC 15 to a lead frame by means of which all other external connections are made. FIG. 5 shows in dotted lines a block 42 of encapsulation material and FIG. 4 shows an electrically insulative adhesive layer 41 by means of which the ASIC is attached to the intermediate portion 14 of the composite strip 14, 15.

Figure 2:
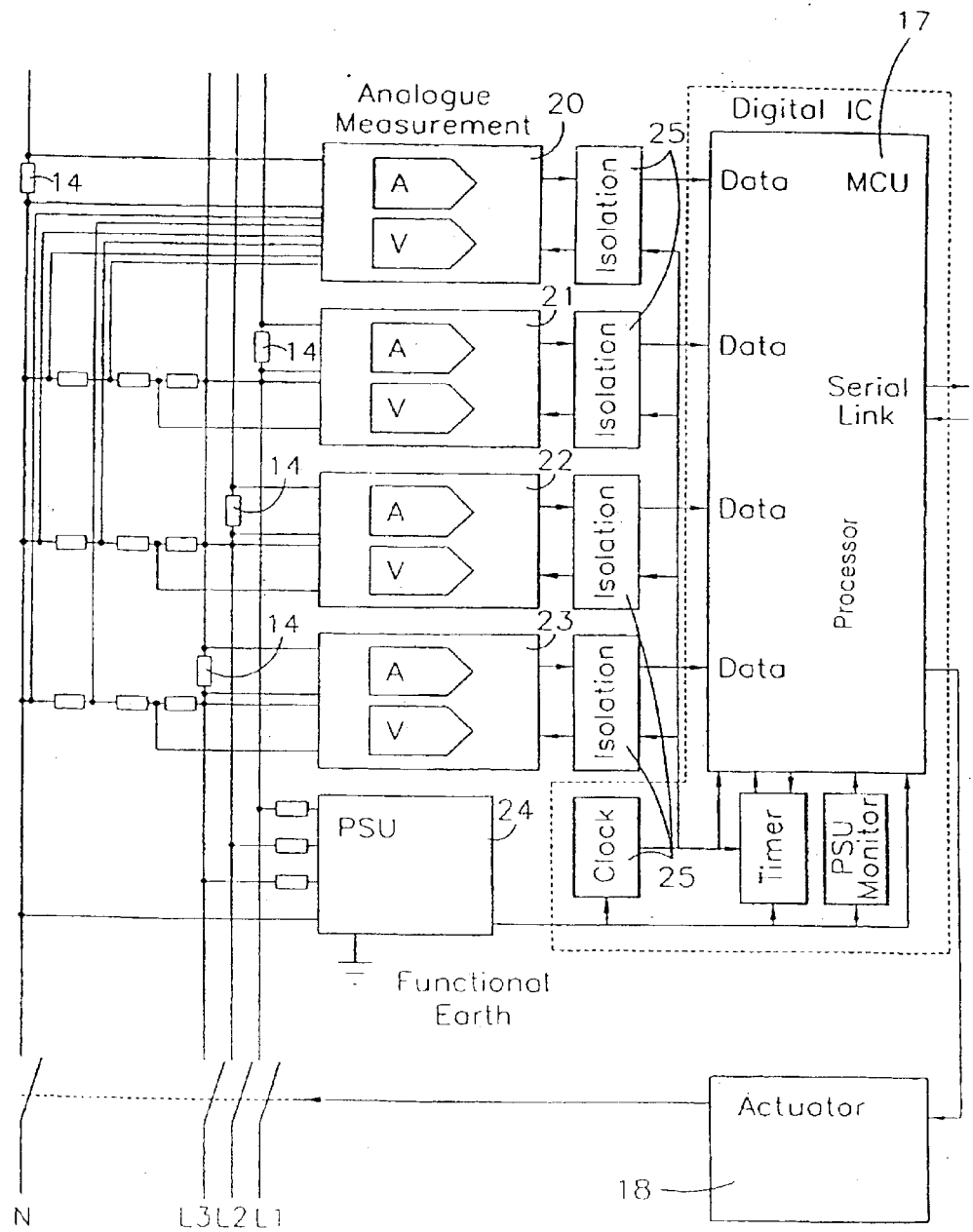
FIG. 2 is a block diagram of an another example of the invention as applied to a three phase device.

FIG. 2 shows in rather more electrical detail a three phase device. In this case there are four shunts 14, one in each phase line and a fourth in the neutral line. The ASICs 15 of FIG. 1 are shown as four separate blocks 20, 21, 22, and 23, and there is a power supply unit 24 which draws power from the phase lines on the mains side of the shunts 14 and provides controlled voltages to the processor 17. Power is supplied to the four blocks 20 to 23 via isolation barriers 25 which make up the array 16. Each block of the ASIC includes an analog to digital converter in the form of a delta-sigma modulator which provides a high frequency one bit digital data stream. A multiplexer may be included in each converter so that the converter can provide to the processor, through the respective isolation barrier, signals representing both current in the associated shunt and the voltage at one end of it. The processor uses these signals to monitor the current in each shunt and to operate the actuator 18 if an imbalance occurs.

It will be noted that the voltage sensing connections to the ASICs are made via resistor chains connected between each phase line and the neutral. Each such resistor chain comprises an outer pair of precision resistors of relatively low ohmic value and an intermediate resistor of relatively high ohmic value. These resistor chains allow the RCD to be provided with an independent reference. If the neutral ADC is taken as the selected system reference, then the operating software of the main processor can use the multiple signals derived from the several resistor chains to calibrate each phase against the neutral reference.

The CPU is programmed to carry out the necessary calculations to determine the existence of an imbalance and can determine the true RMS value of the residual current, which conventional devices fail to do correctly particularly in the case of non-sinusoidal current waveforms. The CPU may be programmed to enable it to determine from the data it receives whether a particular event is, in fact, an unacceptable leakage more reliably than conventional devices. For example, the CPU can take into account the historic performance of the unit when setting the leakage current threshold and may ignore events which have a recognisable "signature".In this way improved tolerance to nuisance tripping can be obtained.

Figure 6:
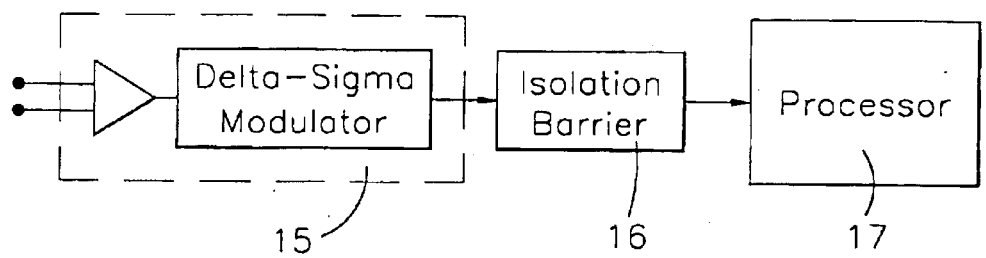
FIG. 6 is a block diagram of a simple form of the electronic circuit of a single current sensor device.

Decimation filtering of the high frequency one bit data stream is required to reduce each data stream to a multi-bit digital signal at a predetermined sample frequency. By way of example, each current signal maybe a 23-bit signal at a sample rate of 64 times the mains frequency, but lower resolution at lower sample rates can be employed when non-linear, rather than linear conversion is acceptable. The decimation filtering is typically a function of the processor, filtering of the four data streams being executed simultaneously so that sample values are derived for all four shunts simultaneously. A circuit employing such an arrangement is shown in FIG. 6.

Figure 7:
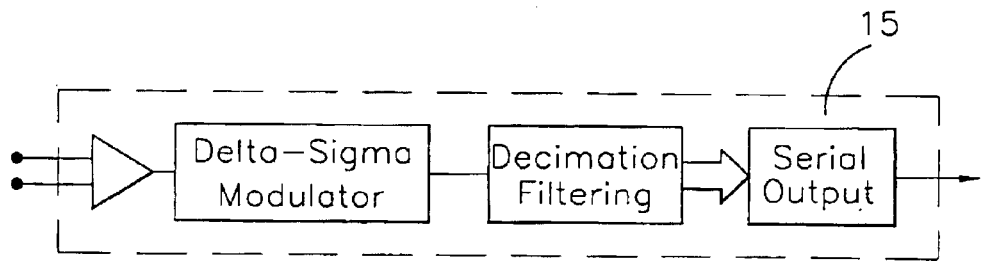
FIG. 7 is a block diagram of an alternative form of the electronic circuit.
Figure 8:
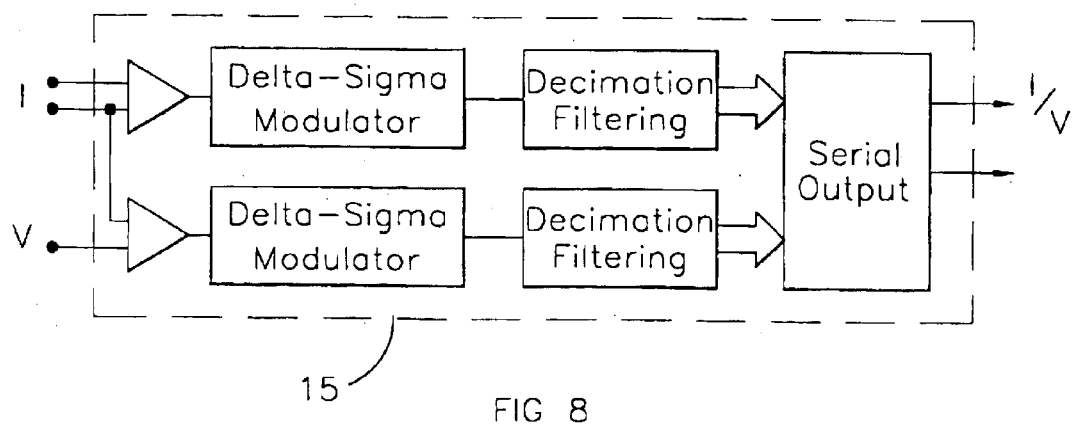
FIG. 8 is a block diagram of yet another form of the electronic circuit.

In an alternative embodiment as shown in FIG. 7, one or more stages of the decimation filtration may be executed by hardware included within the ASIC. Multi-bit digital words are transmitted serially across the isolation barriers instead of a one-bit signal stream. The filtration stages may be split between the ASIC and the processor.

Where current and voltage are both to be monitored as in the system shown in FIG. 2, the circuit 15 may be as shown in FIG. 8 with separate modulations and filtering components for the two signal streams and a common serial interface. Alternatively separate serial interfaces may be employed.

The arrangements described enable very accurate detection of current imbalance to be effected even in the presence of switching transients and DC offsets. The problems which arise from potential saturation of the current transformer core are avoided completely.

Since the CPU receives actual line current and voltage data from each of the blocks 20 to 23, it can be programmed to perform other calculations, such as current limit and power consumption. Thus an RCD device constructed as described above can also provide the functions of a conventional circuit breaker and/or those of a power consumption meter without any additional sensing or analog-to-digital components being required.

What is claimed is:

1. A residual current detection device for continuously monitoring to detect imbalances between currents flowing to a load in one or more phase lines and from said load in a neutral line, comprising:

a plurality of resistive shunts, each connected in series with one of said phase lines and said neutral line; and circuitry for continuously monitoring to detect an imbalance between said currents flowing through the resistive shunts, said circuitry comprising:

an analog-to-digital converter provided for each of the resistive shunts, said analog-to-digital converter for sensing a voltage developed across a corresponding one of the resistive shunts and generating digital signals indicative of the current flowing through the corresponding one of the resistive shunts, said analog-to-digital converter being included in an integated circuit mounted on and electrically connected to the corresponding one of the resistive shunts.

2. The residual current detection device of claim 1, wherein the circuitry further comprises:

a processor for receiving the digital signals from said analog-to-digital converter provided for each of the resistive shunts and processing the digital signals to detect the imbalance between the currents flowing through the resistive shunts.

3. The residual current detection device of claim 2, said circuitry further comprising an isolation barrier through which the analog-to-digital converter is connected to the processor.

4. The residual current detection device of claim 2, wherein the analog-to-digital converter comprises a delta-sigma modulator for producing as the digital signals a high-frequency one-bit digital data stream, and decimation filter for converting the high-frequency one-bit digital data stream to a lower frequency multi-bit digital data stream to be processed by the processor.

5. The residual current detection device of claim 1, wherein the resistive shunt comprises a composite strip having conductive portions at its ends and a resistive portion in the middle interconnecting the conductive portions.

6. The residual current detection device of claim 5, wherein the conductive portions are comprised of copper and the resistive portion is comprised of manganin.

7. The residual current detection device of claim 5, wherein said integrated circuit has a terminal connected to a voltage reference source and a second converter for providing a digital signal stream dependent on a voltage at one of the conductive portions of the associated resistive shunt.

8. The residual current detection device of claim 1, wherein the analog-to-digital converter comprises a delta-sigma modulator for producing as the digital signals a high-frequency one-bit digital data stream.

9. The residual current detection device of claim 1, wherein said circuitry further comprises means for measuring power consumption by the load.

10. The residual current detection device of claim 1, wherein said circuitry further comprises an actuator for performing the function of a conventional circuit breaker.

11. The residual current detection device of claim 1, wherein said circuitry further comprises means for measuring power consumption by the load.

12. The residual current detection device of claim 1, wherein said circuitry further comprises an actuator for performing the function of a conventional circuit breaker.

13. A method of monitoring to detect current imbalance in a residual current detection device between one or more phase lines and a neutral line through which currents respectively flow to and from a load, said method comprising the steps of:

employing a plurality of resistive shunts;

placing each of the resistive shunts in series with a corresponding one of said phase lines and said neutral line;

measuring the current flowing through each of the resistive shunts, said measuring comprising for each of the resistive shunts;

providing an analog-to-digital converter for a corresponding one of the resistive shunts.

employing said analog-to-digital converter for sensing a voltage developed across the corresponding one of the resistive shunts and generating digital signals indicative of the current flowing through the corresponding one of the resistive shunts, and including said analog-to-digital converter in an integrated circuit mounted on and electrically connected to the corresponding one of the resistive shunts; and continuously monitoring the measured currents to detect an imbalance between the currents flowing through the resistive shunts.

14. The method of claim 13, wherein the continuously monitoring step comprises processing the digital signals to determine the imbalance between the currents flowing through the resistive shunts.

15. The method of claim 14, wherein the digital signals are a high-frequency one-bit digital data stream produced by a delta-sigma modulator, further comprising the step of converting the high-frequency one-bit digital data stream into a lower frequency multi-bit digital data stream to be processed to determine the imbalance between the currents flowing through the resistive shunts.

16. The method of claim 13, further comprising generating the digital signals as a digital signal stream dependent on a voltage on one end of the corresponding one of the resistive shunts.

\* \* \* \* \*

UNITED STATES PATENT AND TRADEMARK OFFICE
CERTIFICATE OF CORRECTION

PATENT NO. : 6,788,067 B1
DATED : September 7, 2004
INVENTOR(S) : Robert Charles Skerritt et al.

It is certified that error appears in the above-identified patent and that said Letters Patent is hereby corrected as shown below:

Column 3,
Line 41, ""signature".In" should read -- "signature". In --.
Line 46, "maybe" should read -- may be --.

Column 4,
Line 45, insert -- a -- prior to "decimation".

Column 5,
Line 21, "shunts;" should read -- shunts: --.
Line 23, "shunts." should read -- shunts, --.

Signed and Sealed this

Eighth Day of February, 2005

JON W. DUDAS
*Director of the United States Patent and Trademark Office*